(12) United States Patent
Yoshikawa et al.

(10) Patent No.: US 9,166,089 B2
(45) Date of Patent: Oct. 20, 2015

(54) THIN FILM SOLAR CELL MODULE

(75) Inventors: Kunta Yoshikawa, Settsu (JP); Mitsuru Ichikawa, Settsu (JP); Kenji Yamamoto, Settsu (JP)

(73) Assignee: KANEKA CORPORATION, Osaka (JP)

( * ) Notice: Subject to any disclaimer, the term of this patent is extended or adjusted under 35 U.S.C. 154(b) by 934 days.

(21) Appl. No.: 13/254,446

(22) PCT Filed: Feb. 19, 2010

(86) PCT No.: PCT/JP2010/052517
§ 371 (c)(1),
(2), (4) Date: Sep. 1, 2011

(87) PCT Pub. No.: WO2010/101030
PCT Pub. Date: Sep. 10, 2010

(65) Prior Publication Data
US 2011/0315190 A1    Dec. 29, 2011

(30) Foreign Application Priority Data

Mar. 2, 2009  (JP) ................................. 2009-048125
Mar. 2, 2009  (JP) ................................. 2009-048126

(51) Int. Cl.
*H01L 31/05*         (2014.01)
*H01L 31/078*        (2012.01)
(Continued)

(52) U.S. Cl.
CPC ........ *H01L 31/078* (2013.01); *H01L 31/03921* (2013.01); *H01L 31/03923* (2013.01); *H01L 31/0465* (2014.12); *Y02E 10/541* (2013.01)

(58) Field of Classification Search
CPC . H01L 31/076; H01L 31/074; H01L 31/0687; H01L 31/075; H01L 27/302
USPC ....................................................... 136/244
See application file for complete search history.

(56) References Cited

U.S. PATENT DOCUMENTS 4,243,928 A * 1/1981 Nazimek ........................ 320/101
4,948,436 A * 8/1990 Juergens ........................ 136/249
(Continued)

FOREIGN PATENT DOCUMENTS

JP        5003332 A    1/1993
JP        9129906 A    5/1997
(Continued)

OTHER PUBLICATIONS

ISA The International Bureau of WIPO, International Preliminary Report on Patentability for International Application No. PCT/JP2010/052517, Sep. 22, 2011, 5 pages.
(Continued)

*Primary Examiner* — James Lin
*Assistant Examiner* — Dujuan Horton
(74) *Attorney, Agent, or Firm* — Alleman Hall McCoy Russell & Tuttle LLP

(57) ABSTRACT

Provided is a thin film solar cell module including series-connected unit cells, wherein a thin film silicon photoelectric conversion unit and a compound semiconductor-containing photoelectric conversion unit are electrically connected in each unit cell. Each unit cell includes at least a transparent electrode, an amorphous silicon-containing photoelectric conversion unit, an intermediate transparent electrode layer, a photoelectric conversion unit, a compound semiconductor-based photoelectric conversion unit, and a metal electrode in this order from the light incident side. In each of the unit cells, the photoelectric conversion unit and the compound semiconductor-based photoelectric conversion unit are connected in series to form a series-connected component. The series-connected component is connected to a first photoelectric conversion unit in parallel via the transparent electrode and the intermediate transparent electrode layer.

12 Claims, 2 Drawing Sheets

(51) Int. Cl.
*H01L 31/0392* (2006.01)
*H01L 31/0465* (2014.01)

(56) References Cited

U.S. PATENT DOCUMENTS

| | | | | |
|---|---|---|---|---|
| 5,527,716 | A | * | 6/1996 | Kusian et al. .................. 438/74 |
| 6,077,722 | A | * | 6/2000 | Jansen et al. ................... 438/74 |
| 6,288,325 | B1 | | 9/2001 | Jansen et al. |
| 7,151,217 | B2 | * | 12/2006 | Forrest et al. ................ 136/263 |
| 2010/0116331 | A1 | * | 5/2010 | Kobayashi et al. .......... 136/256 |

FOREIGN PATENT DOCUMENTS

| | | |
|---|---|---|
| JP | 2001177137 A | 6/2001 |
| JP | 2002343986 A | 11/2002 |
| JP | 3721620 B2 | 11/2005 |
| JP | 2008277422 A | 11/2008 |

OTHER PUBLICATIONS

ISA Japanese Patent Office, International Search Report of PCT/JP2010/052517, Jun. 1, 2010, 2 pages.

* cited by examiner

THIN FILM SOLAR CELL MODULE

TECHNICAL FIELD

The invention relates to a thin film solar cell module integrated by connecting unit cells in series, wherein a thin film silicon-based photoelectric conversion unit and a compound semiconductor-based photoelectric conversion unit are electrically connected in each of the unit cells.

BACKGROUND ART

For realization of both reduced cost and enhanced efficiency of a photoelectric conversion device, a thin film solar cell has attracted attention and been vigorously developed in recent years, since it needs fewer raw materials during production. At present, a crystalline silicon thin film solar cell on top of a conventional amorphous silicon thin film solar cell has been developed, and a stacked thin film solar cell called a hybrid solar cell obtained by stacking these cells has been put into practice. Further, studies on a compound semiconductor-based solar cell using compound semiconductor are proceeding, and a product with a higher efficiency than the thin film silicon-based solar cell has been put into practice.

The thin film silicon-based solar cell has advantages in that it is producible by a technique facilitating larger area production, such as CVD, and it has highly excellent volume cost due to raw materials being abundant. Further, although the compound semiconductor-based solar cell is inferior in volume cost to thin film silicon solar cell, it can absorb light by direct transition of electrons, thereby enhancing the efficiency with relative ease.

As for a material for the thin film silicon-based solar cell, amorphous silicon has a band gap of 1.85 to 1.7 eV. Meanwhile, crystalline silicon as a mixed phase of the amorphous silicon and crystal silicon normally has a band gap of 1.4 to 1.2 eV, depending upon a crystalline volume fraction. These thin silicon films can be alloyed with an element such as hydrogen, carbon, oxide, nitrogen or germanium, to adjust a band gap. Further, they can be doped with a material having a different valence electron number from those of silicon, such as boron or phosphorus, to obtain P-type silicon or N-type silicon.

It is to be noted that in this specification, a term "crystalline" includes polycrystalline and microcrystalline, and further includes a material partially including amorphous. Further, a term "silicon-based" includes, other than a simple silicon substance, silicon alloyed with the element such as hydrogen, carbon, oxide, nitrogen or germanium.

In the thin film silicon-based solar cell, normally, a photoelectric conversion unit is formed by a PIN structure where a substantially intrinsic I-type layer is sandwiched between a P-type layer and an N-type layer. With the I-type layer being a light-absorbing layer, a wavelength and a photovoltaic power of photoelectrically convertible light are decided according to a band gap of a material constituting the I-type layer. When energy not smaller than the band gap is absorbed, redundant energy becomes heat or light, and thus cannot be converted into electric power.

Further, it is very unlikely that energy not larger than the band gap would be absorbed. Even in the case of the energy not larger than the band gap being absorbed, electrons are not excited to a conduction band, and thus, also in this case, energy becomes heat or light, and cannot be converted into electric power. Therefore, stacking a plurality of photoelectric conversion units with different band gaps and efficiently converting light energy corresponding to the band gaps into electric power in the respective photoelectric conversion units, which is so-called multi-junction, is essential for improving the efficiency of the thin film solar cell in the future.

A compound semiconductor-based photoelectric conversion unit is an example of one expected to be stacked with the thin film silicon-based photoelectric conversion unit to form multi-junction. Although there are a variety of kinds of compound semiconductor, they are classified into three: a compound made up of a III-group element and a V-group element; a compound made up of a II-group element and a IV-group element; and further, a chalcopyrite-based compound of the I-III-VI$_2$ group as modification of the II-VI group, or the like. Among them, CuInSe$_2$ (hereinafter referred to as CIS) and CuInTe (hereinafter referred to as CIT), as solar cells using the chalcopyrite-based compound, have large absorption coefficients and show sufficient light absorption even with a film thickness being not larger than 1 μm.

The chalcopyrite-based compound has a band gap smaller than 1.0 eV, and excited electrons transit on the bottom of a low conductive band, whereby energy of a visible light component of solar light cannot be efficiently converted into electric power, and the compound as a simple substance is not suitable for the solar cell. For this reason, when it is used in a solar cell, a composition of chalcopyrite-based compound is changed to Cu(In, Ga)Se$_2$ or CuIn(S, Se)$_2$ so as to widen the band gap of the compound semiconductor. However, there is a limit on widening the band gap, and even when the composition is changed, the compound semiconductor-based photoelectric conversion unit used as a single unit cannot be suitable for the solar cell. Therefore, in order to obtain a solar cell with high practicability, a multi-junction of the compound semiconductor-based photoelectric conversion unit with other unit(s) is important.

Patent Document 1 provides a method for producing a high-efficiency solar cell in which an epitaxial growth of III-V group compound semiconductor onto a single crystal Si substrate is performed. However, forming a GaAs-based photoelectric conversion unit requires a large amount of As, and its adverse effect upon the environment is concerned. Further, since the compound semiconductor layer is required to be deposited onto the Si single crystal plane for the epitaxial growth, it is not realistic as a method for producing a large area module.

In a general chalcopyrite-based compound semiconductor-based solar cell, zinc oxide/CdS are used as a window layer on an N-type layer side. Therefore, in the chalcopyrite-based compound semiconductor-based solar cell, allowing light to be incident from the N-type layer side is one of conditions for improving the efficiency. Meanwhile, conditions for improving the efficiency of the solar cell having an amorphous silicon-based photoelectric conversion unit may include that: light is allowed to be incident from the P-type layer side of the amorphous silicon-based photoelectric conversion unit; a rate of a current of the amorphous silicon-based photoelectric conversion unit is not limited even when a multi-junction is formed; and characteristic deterioration due to photodegradation of the amorphous silicon-based photoelectric conversion unit is small.

It is expected that stacking a low-cost thin film silicon-based photoelectric conversion unit and a chalcopyrite-based compound semiconductor photoelectric conversion unit as a narrow band gap material with high sensitivity on the long wavelength side to form a multi-junction as described above can enhance the efficiency of the thin film photoelectric conversion device. However, advantages thereof cannot be sufficiently utilized when a multi-junction is formed by simply stacking them, since it is preferable to allow light to be incident from the P-type layer side on the amorphous silicon-based photoelectric conversion unit, and from the N-type layer side on the chalcopyrite-based compound semiconductor photoelectric conversion unit. Further, it is difficult to match current densities of these two photoelectric conversion units to prevent rate-limiting of the current of the amorphous silicon-based photoelectric conversion unit. There has thus been no example to date in which the amorphous silicon-based photoelectric conversion unit and the chalcopyrite-based compound semiconductor photoelectric conversion unit are stacked in a multi-junction and modularized manner.

RELATED ART DOCUMENT

Patent Document

Patent Document 1: Japanese Patent Application Laid-Open No. H5-3332)

DISCLOSURE OF THE INVENTION

Problem to be Solved by the Invention

An object of the invention is to provide a high-efficiency and low-cost thin film solar cell module in which a thin film silicon-based photoelectric conversion unit and a compound semiconductor-based photoelectric conversion unit are electrically connected and further integrated by connecting unit cells in series, that have conventionally been difficult to be obtained.

A thin film solar cell module of the invention includes at least a transparent electrode 2, a first photoelectric conversion unit 3, an intermediate transparent electrode layer 4, a second photoelectric conversion unit 5, a third photoelectric conversion unit 6, and a metal electrode 7, in this order from the light incident side. The first to third photoelectric conversion units are electrically connected to form a unit cell, and a plurality of unit cells are integrated by connecting the unit cells in series. The first photoelectric conversion unit 3 is an amorphous silicon-based photoelectric conversion unit, and the third photoelectric conversion unit 6 is a compound semiconductor-based photoelectric conversion unit. The second photoelectric conversion unit 5 and the third photoelectric conversion unit 6 are connected in series to form a series-connected component 10 inside each unit cell, and the series-connected component 10 is connected in parallel with the first photoelectric conversion unit 3 via the transparent electrode 2 and the intermediate transparent electrode layer 4.

In a first embodiment of the invention, as shown in FIGS. 1 and 2, a transparent electrode 2, an amorphous silicon-based photoelectric conversion unit as a first photoelectric conversion unit 3, an intermediate transparent electrode layer 4, a second photoelectric conversion unit 5, a compound semiconductor-based photoelectric conversion unit as a third photoelectric conversion unit 6, and a metal electrode 7 are formed on a transparent insulating substrate 1 in this order from a light incident side.

In manufacturing of the photoelectric conversion device according to the first embodiment of the invention, it is preferable that light is irradiated from the surface side where the deposition is being performed during deposition of the compound semiconductor-based photoelectric conversion unit 6, so that a temperature increase in the amorphous silicon-based photoelectric conversion unit 3 is suppressed.

In a second embodiment of the invention, as shown in FIGS. 3 and 4, the metal electrode 7, the compound semiconductor-based photoelectric conversion unit as the third photoelectric conversion unit 6, the second photoelectric conversion unit 5, the intermediate transparent electrode layer 4, the amorphous silicon-based photoelectric conversion unit as the first photoelectric conversion unit 3, and the transparent electrode 2, are formed on an insulating substrate 1 from a side opposite to a light incident side.

In the invention, it is preferable that electric connection of the photoelectric conversion units inside each unit cell and integration of a plurality of unit cells are formed by the following configuration:

The transparent electrode 2 inside each unit cell and the transparent electrode 2 inside an adjacent unit cell are separated by a transparent electrode separation groove A.

The transparent electrode 2 inside each unit cell and the intermediate transparent electrode layer 4 inside the adjacent unit cell are short-circuited by a first-type connection groove B.

The intermediate transparent electrode layer 4 inside each unit cell and the metal electrode 7 inside the same unit cell are insulated by an intermediate electrode separation groove C.

The transparent electrode 2 inside each unit cell and the metal electrode 7 inside the same unit cell are short-circuited by a second-type connection groove D.

The metal electrode 7 inside each unit cell and the metal electrode 7 inside the adjacent unit cell are separated by a metal electrode separation groove E.

In a preferred embodiment of the invention, an insulating layer 8 is formed on a side surface of the series-connected component 10 and on a side surface of the intermediate transparent electrode layer 4, as shown in FIGS. 2 and 4. Further, from the viewpoint of enhancing the efficiency, it is preferable that the amorphous silicon-based photoelectric conversion unit as the first photoelectric conversion unit has a p-type layer on the light incident side, and the second photoelectric conversion unit and the compound semiconductor-based photoelectric conversion unit as the third photoelectric conversion unit have N-type layers on the light incident side.

In the invention, a light-absorbing layer of the third photoelectric conversion unit preferably has a band gap of not larger than 1.1 eV. The photoelectric conversion unit is preferably made of a chalcopyrite-based compound semiconductor. The second photoelectric conversion unit is preferably a crystalline silicon-based photoelectric conversion unit.

Advantage of the Invention

In the thin film solar cell module of the invention, a series-connected component consisting of the compound semiconductor-based photoelectric conversion unit and the second photoelectric conversion unit is formed inside each unit cell, and the series-connected component and the amorphous silicon-based photoelectric conversion unit are connected in parallel. It is therefore possible to prevent rate-limiting of a current of the amorphous silicon-based photoelectric conversion unit even when a multi-junction is formed. Further, while the amorphous silicon-based photoelectric conversion unit can be configured such that light is allowed to be incident from the P-type layer side, the compound semiconductor-based photoelectric conversion unit can be configured such that light is allowed to be incident from the N-type layer side, whereby it is possible to adopt a design with optimized photoelectric conversion efficiency in each photoelectric conversion unit.

Further, a photoelectric conversion unit, having an output voltage close to a difference between an output voltage of the compound semiconductor-based photoelectric conversion unit and an output voltage of the amorphous silicon-based photoelectric conversion unit, is used as the second photoelectric conversion unit 5, whereby it is possible to perform matching of voltages as well as currents inside the unit cell. Therefore, according to the invention, a thin film solar cell having multi-junction and small photodegradation may be obtained at low cost, without loss of the respective advantages of the amorphous silicon-based photoelectric conversion unit and the compound semiconductor-based photoelectric conversion unit.

DESCRIPTION OF EMBODIMENTS

Hereinafter, thin film solar cell modules as embodiments of the invention will be described with reference to the drawings.

Figure 1:
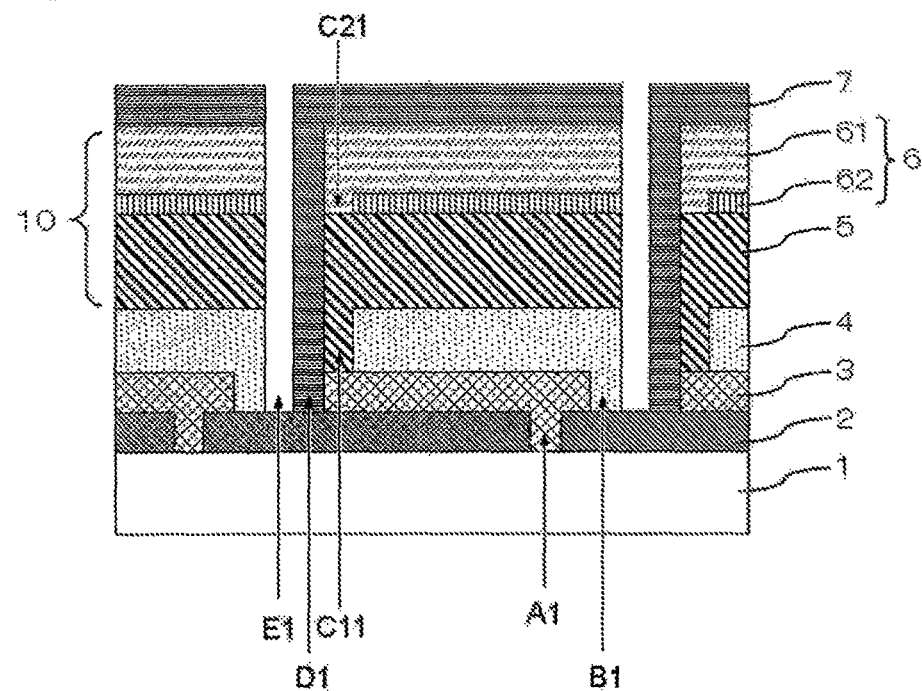
FIG. 1 is a sectional view according to an aspect (Example 1) of a first embodiment of the invention.
Figure 2:
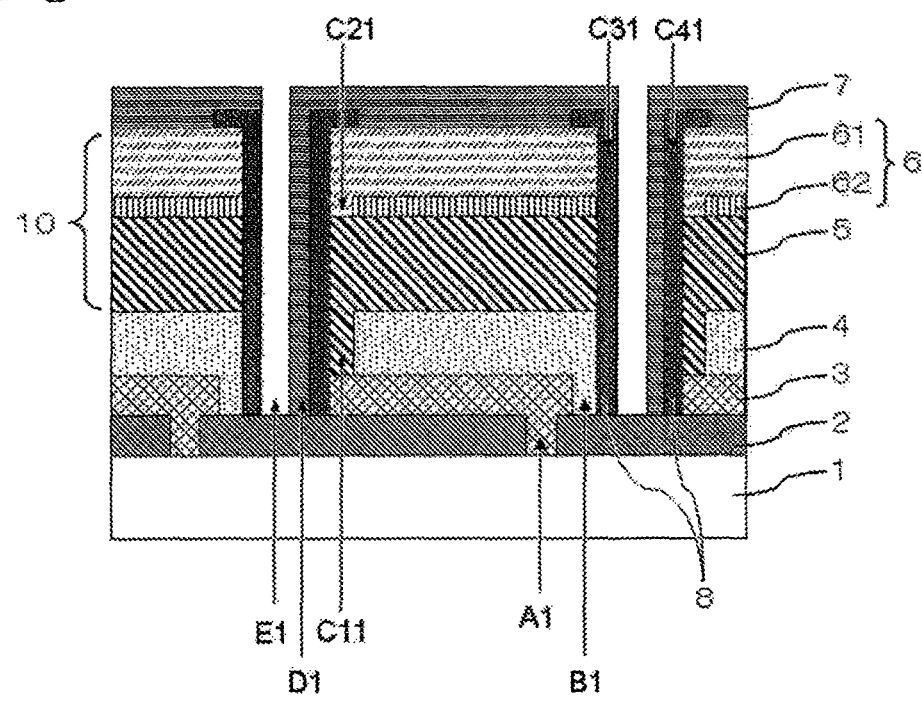
FIG. 2 is a sectional view according to an aspect (Example 2) of the first embodiment of the invention.

FIGS. 1 and 2 are sectional views each schematically showing an example of a thin film solar cell module according to a first embodiment of the invention. The first embodiment is a so-called superstrate-type thin film solar cell in which the transparent electrode 2, the first photoelectric conversion unit 3, the intermediate transparent electrode layer 4, the second photoelectric conversion unit 5, the third semiconductor photoelectric conversion unit 6, and the metal electrode 7 are formed in this order on the transparent insulating substrate 1 on the light incident side.

As the transparent insulating substrate 1, a plate-like member or a sheet-like member made of glass, a transparent resin or the like is used. The transparent electrode 2 is preferably made up of a conductive metal oxide, specifically, $SnO_2$, ZnO, $In_2O_3$ and the like may be preferred examples thereof. The transparent electrode 2 is preferably formed by a deposition method such as CVD, sputtering or vapor deposition.

The transparent electrode 2 desirably has an effect of increasing incident light scattering. Specifically, a surface of the transparent electrode desirably has fine irregularities so as to have the effect of increasing scattering of incident light. Further, when the transparent electrode 2 is exposed to a certain amount of hydrogen plasma during the deposition of the amorphous silicon-based photoelectric conversion unit 3 formed thereon a metal oxide constituting the transparent electrode may be reduced to cause significant deterioration in transmittance and resistance ratio. From the viewpoint of suppressing reduction of the metal oxide in the case of being exposed to hydrogen plasma, a main component of a surface of the transparent electrode 2 contacting with the amorphous silicon-based photoelectric conversion unit 3 is preferably zinc oxide. For example, when the transparent electrode 2 is a metal oxide that is easily reduced, it is preferable that the surface of the transparent electrode 2 is covered with ZnO resistant to chemical reduction.

In the transparent electrode 2, the transparent electrode separation groove A1 for separating the transparent electrode into unit cells is formed. For formation of the separation groove A1, a laser is preferably used, and an IR laser with a wavelength of not less than 900 nm is preferably irradiated from the transparent insulating substrate 1 side. Further, the deposition of the transparent electrode 2 may be performed with a mask being placed so that the separation groove A1 is formed. The separation groove A1 is filled with a material constituting the amorphous silicon-based photoelectric conversion unit 3.

On the transparent electrode 2, the first photoelectric conversion unit is formed as the amorphous silicon-based photoelectric conversion unit 3. From the viewpoint of improving conversion efficiency, the amorphous silicon-based photoelectric conversion unit 3 is preferably formed with a P-type layer, an I-type layer, and an N-type layer in this order from the light incident side (the transparent insulating substrate 1 side), and is for example made up of an amorphous P-type silicon carbide layer, a substantially intrinsic amorphous silicon-based photoelectric conversion layer, and an N-type silicon-based interface layer. High-frequency plasma enhanced CVD is suitable for formation of the amorphous silicon-based photoelectric conversion unit 3.

As conditions for forming each layer of the amorphous silicon-based photoelectric conversion unit 3, a substrate temperature of 100 to 300° C., a pressure of 30 to 1500 Pa, and a high-frequency power density of 0.01 to 0.5 W/cm$^2$ are preferably used. As a raw material gas for use in formation of the photoelectric conversion unit, a silicon-containing gas such as $SiH_4$ or $Si_2H_6$, or a mixture of those gases with $H_2$ is used. As a dopant gas for forming the P-type layer or the N-type layer in the photoelectric conversion unit, $B_2H_6$, $PH_3$ or the like is preferably used. An amorphous silicon-based photoelectric conversion unit 3 having wider bandgap may be obtained by willingly introducing $H_2$.

In the amorphous silicon-based photoelectric conversion unit 3, a first-type connection groove B1 is formed so that the intermediate transparent electrode layer 4 formed on the unit and the transparent electrode 2 are short-circuited. For forming the first-type connection groove B1, a laser may be used, or the deposition of the amorphous silicon-based photoelectric conversion unit may be performed using a mask. From the viewpoint of productivity, the laser is preferably used, and for avoiding damage on the transparent electrode 2, laser with a wavelength of 500 to 700 nm is preferably used. The first-type connection groove B1 is filled with a conductive material constituting the intermediate transparent electrode layer 4 to short-circuit the transparent electrode 2 and the intermediate transparent electrode layer 4.

When the conductive material of the intermediate transparent electrode layer 4 or the like adheres to the side surface of the amorphous silicon-based photoelectric conversion unit 3 on the first-type connection groove B1 side, diode characteristics of the photoelectric conversion unit may deteriorate due to a leak current from the side surface. In order to prevent such side leakage, it is preferable to form a layer (not shown) made of a material with low conductivity on the side surface. For example, when laser is irradiated in an oxide atmosphere to cut the amorphous silicon-based photoelectric conversion unit 3 to form the first-type connection groove B1, the cutting surface is oxidized, and hence the cutting surface constitutes an oxide silicon layer to obtain the function of preventing a leak current from the side surface.

The intermediate transparent electrode layer 4 is formed on the amorphous silicon-based photoelectric conversion unit 3. As a material constituting the intermediate transparent electrode layer, a conductive metal oxide is desirable as is the transparent electrode 2. When the amorphous silicon-based photoelectric conversion unit 3 has the P-type layer on the light incident side, the intermediate transparent electrode layer 4 comes into contact with the N-type layer of the amorphous silicon-based photoelectric conversion unit 3 and the N-type layer of the second photoelectric conversion unit 5. For this reason, at least an interface where the intermediate transparent electrode layer is in contact with the first photoelectric conversion unit 3 and an interface where the intermediate transparent electrode layer is in contact with the second photoelectric conversion unit need to be layers that can be electrically in contact with the N-type layer.

Further, depending upon deposition conditions for the second photoelectric conversion unit 5, the intermediate transparent electrode layer 4 may be exposed to a certain amount of hydrogen plasma, and a metal oxide constituting the intermediate transparent electrode layer 4 may be reduced, causing significant deterioration in transmittance and resistance ratio. From the viewpoint of suppressing reduction of the metal oxide in the case of being exposed to hydrogen plasma, a surface of the intermediate transparent electrode layer 4 contacting with the second photoelectric conversion unit 5 is preferably mainly composed of zinc oxide. For example, when the transparent electrode 2 is a metal oxide being easily reduced, it is preferable that the surface of the intermediate transparent electrode layer 4 is covered with ZnO resistant to chemical reduction, i.e., passive ZnO. Further, it is preferable to perform similar processing on the amorphous silicon-based photoelectric conversion unit 3 side surface of the intermediate transparent electrode layer 4, from the viewpoint of electric contact.

For preventing the intermediate transparent electrode layer and the metal electrode 7 from being short-circuited, an intermediate electrode separation groove C11 is preferably formed on the side surface, on the opposite side to the first-type connection groove B1, of the intermediate transparent electrode layer 4 in each unit cell. For formation of the intermediate electrode separation groove C11, the laser may be used, or the deposition of the intermediate transparent electrode layer 4 may be performed using a mask. In the case of using the laser, an IR laser having a wavelength of not less than 900 nm is preferably irradiated from the back-surface side (opposite side to the transparent insulating substrate 1). The intermediate electrode separation groove C11 is filled with a material constituting the second photoelectric conversion unit 5, and the side surface of the intermediate transparent electrode layer 4 is covered to prevent a short-circuit of the intermediate transparent electrode layer and the metal electrode 7. Further, forming the intermediate electrode separation groove C11 can prevent generation of a leak current due to a short circuit on the side surface of the photoelectric conversion unit. Details of prevention of the leak current due to the short circuit on the side surface will be described later in a description regarding the example of FIG. 2.

The second photoelectric conversion unit 5 is formed on the intermediate transparent electrode layer 4. When the amorphous silicon-based photoelectric conversion unit 3 has a P-type layer on the light incident side, the second photoelectric conversion unit 5 has an N-type layer on the light incident side. An output voltage $V_2$ of the second photoelectric conversion unit 5 is preferably smaller than an output voltage $V_1$ of the amorphous silicon-based photoelectric conversion unit 3, and larger than an output voltage $V_3$ of the compound semiconductor-based photoelectric conversion unit 6. Further, the output voltage $V_2$ of the second photoelectric conversion unit 5 is preferably close to a difference $(V_1-V_3)$ between the output voltage $V_1$ of the amorphous silicon-based photoelectric conversion unit 3 and the output voltage $V_3$ of the compound semiconductor-based photoelectric conversion unit 6. Specifically, an absolute value of $\{V_1-(V_2+V_3)\}$ is preferably not larger than 0.3 V, and further preferably not larger than 0.2 V. Setting the output voltage $V_2$ of the second photoelectric conversion unit 5 in the above range can optimize a voltage of parallel-connected component inside each photoelectric conversion cell, thereby to obtain a photoelectric conversion device having a high power output.

Examples of such a photoelectric conversion unit may include a crystalline silicon-based photoelectric conversion unit having a crystalline silicon i-type layer and an amorphous silicon germanium photoelectric conversion unit having amorphous hydrogenated silicon germanium i-type layer. When the compound semiconductor-based photoelectric conversion unit 6 is a chalcopyrite-based compound semiconductor photoelectric conversion unit, preferred examples of the second photoelectric conversion unit 5 may include the crystalline silicon-based photoelectric conversion unit. The crystalline silicon-based photoelectric conversion unit is normally made up of an N-type crystalline silicon layer, a substantially intrinsic crystalline silicon-based photoelectric conversion layer, and a P-type crystalline silicon layer. It is further preferable that an N-type amorphous silicon-based interface layer is inserted between the crystalline silicon-based photoelectric conversion layer and the N-type crystalline silicon layer. The high-frequency plasma enhanced CVD is suitable for formation of the second photoelectric conversion unit 5.

As conditions for forming each layer of the crystalline silicon-based photoelectric conversion unit, a substrate temperature of 100 to 300° C., a pressure of 30 to 3000 Pa, and a high-frequency power density of 0.1 to 0.5 W/cm$^2$ are preferably used. As a raw material gas for use in formation of the photoelectric conversion unit, a silicon-containing gas such as SiH$_4$ or Si$_2$H$_6$, or a mixture of those gases with H$_2$ is used. As a dopant gas for forming the P layer or the N layer in the photoelectric conversion unit, B$_2$H$_6$, PH$_3$ or the like is preferably used.

On the second photoelectric conversion unit 5, the compound semiconductor-based photoelectric conversion unit 6 is formed as the third photoelectric conversion unit. The second photoelectric conversion unit 5 and the third photoelectric conversion unit 6 are connected in series to form the series-connected component 10. A compound semiconductor-based photoelectric conversion unit 6 preferably includes a light absorbing layer 61 with a band gap of not larger than 1.1 eV. Among them, a chalcopyrite-based compound semiconductor photoelectric conversion unit is preferred, and a photoelectric conversion unit having a CIS layer as the light-absorbing layer 61 with a band gap of about 0.9 to 1.1 eV is particularly preferred.

Deposition of the CIS layer is desirably performed by controlling a substrate temperature such that the temperature is not higher than 500° C. by three-source vapor deposition. When the substrate temperature is raised up to 200° C. in the deposition of the compound semiconductor-based photoelectric conversion unit 6, diode characteristics of the amorphous silicon-based photoelectric conversion unit 3 may deteriorate severely. Therefore, it is preferable to irradiate light from the deposition surface side during deposition of the compound semiconductor, so that the deposition surface is heated by radiant heat and the temperature of the deposition top surface is increased. The light irradiated on the surface is preferably pulse light using a xenon light source, and the temperature of the amorphous silicon-based photoelectric conversion unit 3 is preferably prevented from being increased.

In the compound semiconductor-based photoelectric conversion unit 6, it is preferable to form a window layer 62 on the light incident side before formation of the light-absorbing layer 61. Generally, since the light-absorbing layer 61 made of chalcopyrite-based semiconductor such as CIS has P-type conductive characteristics, the window layer 62 preferably has N-type conductive characteristics. As the window layer 62, a zinc oxide layer, a CdS layer and the like are preferably used. In the case where the window layer 62 is made of the conductive material such as zinc oxide, as shown in FIGS. 1 and 2, a window layer separation groove C21 is preferably formed on the side surface on the intermediate electrode separation groove C11 side of the window layer in each unit cell, so that the short-circuit between the window layer 62 and the back-surface metal electrode 7 is prevented. The window layer separation groove C21 is preferably formed by using a mask at the time of forming the window layer 62. The window layer separation groove C21 is filled with a material constituting the compound semiconductor-based photoelectric conversion unit 6 to insulate the window layer 62 and the metal electrode 7. Further, a leak current due to a short circuit on the side surface of the photoelectric conversion unit may be prevented by forming the window layer separation groove C21. Details of prevention of the leak current due to short circuit on the side surface will be described later in a description regarding the example of FIG. 2.

In the example shown in FIG. 1, a second-type connection groove D1 for short-circuiting the metal electrode 7 and the transparent electrode 2 is formed after formation of the compound semiconductor-based photoelectric conversion unit 6. Meanwhile, in the example shown in FIG. 2, separation grooves C31 and C41 for forming the insulating layer 8 are formed before formation of the second-type connection groove D1. In the embodiment shown in FIG. 2, the insulating layer 8 is provided on the side surfaces of the amorphous silicon-based photoelectric conversion unit 3 to the compound semiconductor-based photoelectric conversion unit 6 so that short-circuit between the first photoelectric conversion unit 3 and the series-connected component 10, made up of the second photoelectric conversion unit 5 and the third photoelectric conversion unit 6, is prevented.

In forming the insulating layer 8 on the side surface of the photoelectric conversion unit, the separation grooves C31 and C41 are formed by removing the layers along from the first photoelectric conversion unit 3 to the third photoelectric conversion unit 6. Each of the separation groove C31 and the separation groove C41 is shown as one groove in FIG. 2, since the photoelectric conversion device after formation of the connection groove D1, in which the metal electrode 7 and a separation groove E1, is illustrated in the drawing. But the separation groove C31 in one unit cell and the separation groove C41 in an adjacent unit cell can be formed at once as one groove during their formation. In order to avoid damage on the transparent electrode 2, a laser with a wavelength of 500 to 700 nm is preferably irradiated from the transparent insulating substrate 1 side.

Next, the insulating layer 8 is formed so as to fill the separation grooves C31 and C41. A material with a conductive ratio of not larger than $1\times10^{-4}$ S/cm is preferably used for forming the insulating layer 8. For example, an insulating material such as silicon nitride or silicon oxide is preferably used. Among them, silicon nitride is particularly preferred from the viewpoints of insulation properties, deposition properties, and durability.

As conditions for forming a silicon nitride insulating layer, conditions of a substrate temperature of 100 to 300° C., a pressure of 30 to 1500 Pa, and a high-frequency power density of 0.01 to 0.3 W/cm$^2$ are preferably used. As a raw material gas for use in formation of silicon nitride, SiH$_4$, NH$_3$, and H$_2$ are preferred.

It is to be noted that, other than the forementioned method of forming the separation grooves C31 and C41 before formation of the second-type connection groove D1 to form the insulating layer of silicon nitride or the like, the insulating layer 8 can also be formed by a method where, at the time of forming the second-type connection groove D1 and the metal electrode separation groove E1, each photoelectric conversion unit is cut in an oxide atmosphere to oxidize the cut surface, so as to reduce conductivity.

The second-type connection groove D1 is formed by removing the layers along from the amorphous silicon-based photoelectric conversion unit 3 to the compound semiconductor-based photoelectric conversion unit 6. In the embodiment shown in FIG. 1, the connection groove D1 is preferably formed by laser. The formation of the connection groove D1 by laser is preferably performed such that a laser with a wavelength of 500 to 700 nm is irradiated from the transparent insulating substrate 1 side, and the amorphous silicon-based photoelectric conversion unit 3 is abraded, leading to removal of the amorphous silicon-based photoelectric conversion unit 3 to the compound semiconductor-based photoelectric conversion unit 6.

Further, as shown in FIG. 2, when the separation grooves C31 and C41 are formed and the insulating layer 8 is formed inside the separation grooves, the second-type connection groove D1 is formed such that the insulating layer 8 remains on the side surface of the photoelectric conversion unit. Also in this case, as in the embodiment shown in FIG. 1, the second-type connection groove D1 is preferably formed by laser.

Deposition of the metal electrode 7 as the back-surface electrode is performed on the compound semiconductor-based photoelectric conversion unit 6. Mo is preferably deposited as the back-surface metal electrode. Examples of vapor deposition method may include electron beam vapor deposition and sputtering vapor deposition. The second-type connection groove D1 is filled with a conductive material constituting the back-surface metal electrode 7, so that the transparent electrode 2 and the metal electrode 7 are short-circuited.

Finally, the metal electrode separation groove E1 for separating the metal electrode 7 into unit cells is formed. Although the metal electrode separation groove E1 may be formed by using a mask at the time of deposition of the back-surface metal electrode 7, it is preferably formed by laser irradiation after deposition of the back-surface metal electrode 7. Formation of the separation groove E1 by the laser is preferably performed such that a YAG second harmonic laser irradiates the transparent insulating substrate 1 side, and the amorphous silicon-based photoelectric conversion unit 3 is abraded, leading to removal of the amorphous silicon-based photoelectric conversion unit 3 to the back-surface metal electrode 7.

As thus described, each layer, separation groove and connection groove is formed, to obtain an integrated photoelectric conversion device. Inside each unit cell, the second photoelectric conversion unit 5 and the third photoelectric conversion unit 6 are connected in series to form the series-connected component 10. The series-connected component 10 is connected in parallel with the first photoelectric conversion unit 3 via the intermediate transparent electrode layer 4, the transparent electrode 2 and the metal electrode 7. Further, the transparent electrode 2 in each unit cell and the intermediate transparent electrode layer 4 in the adjacent unit cell are short-circuited, whereby the plurality of adjacent unit cells is connected in series.

In FIG. 2, the insulating layer 8 is formed inside the separation grooves C31 and C41 and the intermediate electrode separation groove C11 and the window layer separation groove C21 are further formed. While, in the case where the side surfaces of the intermediate transparent electrode layer 4 and the window layer 62 are covered with the insulating layer 8, the separation grooves C11 and C21 may be formed, or formation of the separation grooves C11 and C21 may be omitted. In the case where the separation grooves C11 and C21 are not formed, the separation groove C41 serves as the intermediate electrode separation groove and the window layer separation groove. In addition, the insulating layer 8 inside the separation groove C41 insulates the intermediate transparent electrode layer 4, the window layer 62 and the metal electrode 7. In the case where the groove C41 is formed by laser irradiation, the separation grooves C11 and C21 are preferably formed. In the case where the separation grooves C11 and C21 are not formed, at the time of forming the separation groove C41, the conductive material is exposed to the side surfaces on the separation side C41 of the intermediate transparent electrode layer 4 and the window layer 62. Therefore, when laser is irradiated to the side surfaces to form the separation groove C41, the conductive materials of the intermediate transparent electrode layer 4 and the window layer 62 which have melt due to the laser may adhere to the side surfaces of the second photoelectric conversion unit 5 and the light-absorbing layer 61 of the compound semiconductor-based photoelectric conversion unit 6, leading to cause a short-circuit to generate a leak current. On the contrary, in the case where the separation grooves C11 and C21 are previously formed, the side surfaces of the intermediate transparent electrode layer 4 and the window layer 62 are covered with the semiconductor layer, and thereby, the conductive material does not adhere to the side surface of the photoelectric conversion unit, which can prevent generation of the leak current.

Figure 3:
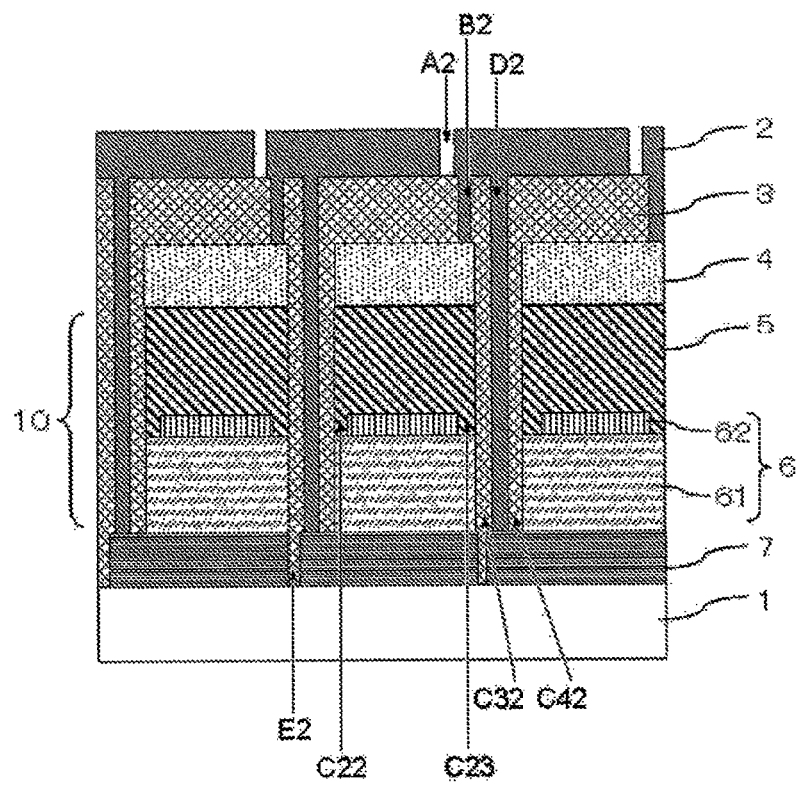
FIG. 3 is a sectional view according to an aspect (Example 3) of a second embodiment of the invention.
Figure 4:
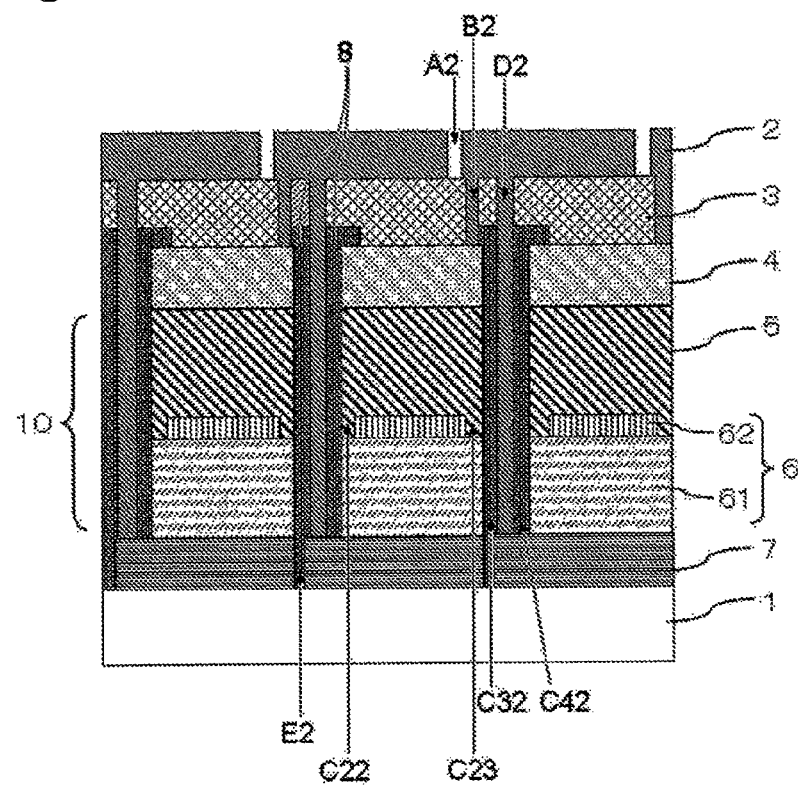
FIG. 4 is a sectional view according to an aspect (Example 4) of the second embodiment of the invention.

Hereafter, a second embodiment of the invention will be described. FIGS. 3 and 4 are sectional views each schematically showing example of a thin film solar cell module according to a second embodiment of the invention. The second embodiment is a so-called substrate-type thin film solar cell in which a metal electrode 7, a third semiconductor photoelectric conversion unit 6, a second photoelectric conversion unit 5, an intermediate transparent electrode layer 4, a first photoelectric conversion unit 3, and a transparent electrode 2 are formed in this order on an insulating substrate 1 on the opposite side to the light incident side.

As the insulating substrate 1, a plate-like member, a sheet-like member or the like made of glass, a transparent resin or the like is used. It is known that, when the chalcopyrite-based compound semiconductor photoelectric conversion unit is used as the compound semiconductor-based photoelectric conversion unit 6, Ia group elements are diffused from the insulating substrate 1 via the metal electrode 7, thereby promoting crystallization of chalcopyrite-based compound semiconductor. Accordingly, a substrate made up of material containing Ia group element such as Na, like soda lime glass, is preferred as the insulating substrate 1.

The metal electrode 7 is formed on the transparent insulating substrate 1. Mo is preferred as the metal electrode 7. Examples of a deposition method for the metal electrode may include electron beam vapor deposition and sputtering vapor deposition.

A metal electrode separation groove E2 for separating the metal electrode into unit cells is formed in the metal electrode 7. For formation of the separation groove E2, IR laser having a wavelength of not smaller than 900 nm is preferably used. When the insulating substrate 1 is a transparent insulating substrate such as glass or a transparent resin, the laser is preferably irradiated from the transparent insulating substrate 1 side. Further, the separation groove E2 may be formed by performing the deposition of the metal electrode 7 with a mask being placed.

On the metal electrode 7, the compound semiconductor-based photoelectric conversion unit 6 as the third photoelectric conversion unit is formed. As the compound semiconductor-based photoelectric conversion unit 6, a conversion unit having a light absorbing layer 61 with a band gap of not larger than 1.1 eV is preferably used. Among them, chalcopyrite-based compound semiconductor photoelectric conversion unit is preferred, and a photoelectric conversion unit having a CIS layer as the light-absorbing layer 61 with a band gap of about 0.9 to 1.1 eV is particularly preferred. Deposition of the CIS layer is desirably performed by controlling a substrate temperature such that the temperature is not higher than 500° C. by means of the three-source vapor deposition.

In the compound semiconductor-based photoelectric conversion unit 6, a window layer 62 is preferably formed on the light incident side. Generally, since the light-absorbing layer 61 made of chalcopyrite-based semiconductor such as CIS has P-type conductive characteristics, the window layer 62 preferably has N-type conductive characteristics. As the window layer 62, a zinc oxide layer, a CdS layer and the like are preferably used. The CdS layer is formed for example by solution deposition or selenization process. The zinc oxide layer is formed for example by sputtering, thermal CVD, or the like.

In the case where the window layer 62 is made of the conductive material such as zinc oxide, as shown in FIGS. 3 and 4, window layer separation grooves C22 and C23 are preferably formed on both side surfaces of the window layer 62. The window layer separation grooves C22 and C23 are filled with a material constituting the second photoelectric conversion unit 2. In the case where the separation grooves C22 and C23 are not formed, at the time of forming separation grooves C32 and C42, the conductive material is exposed to the side surfaces on the separation side C41 of the intermediate transparent electrode layer 4 and the window layer 62. Therefore, when laser is irradiated to the side surfaces to form the separation groove C41, the conductive material of the window layer 62 which has melted due to the laser, may adhere to the side surface of the second photoelectric conversion unit 5, leading to the generation of a leak current caused by a short-circuit. On the contrary, when the separation grooves C22 and C23 are formed in advance, the side surface of the window layer 62 is covered with the semiconductor layer, whereby the generation of a leak current can be prevented without the conductive material adhering to the side surface of the photoelectric conversion unit 5.

The second photoelectric conversion unit 5 is formed on the compound semiconductor-based photoelectric conversion unit 6. When the compound semiconductor-based photoelectric conversion unit 6 has the N-type window layer 62 on the light incident side, the second photoelectric conversion unit 5 has the N layer on the light incident side. An output voltage $V_2$ of the second photoelectric conversion unit 5 is preferably smaller than an output voltage $V_1$ of the amorphous silicon-based photoelectric conversion unit 3, and is larger than an output voltage $V_3$ of the compound semiconductor-based photoelectric conversion unit 6. Further, the output voltage $V_2$ of the second photoelectric conversion unit 5 is preferably close to a difference $(V_3-V_1)$ between the output voltage $V_1$ of the amorphous silicon-based photoelectric conversion unit 3 and the output voltage $V_3$ of the compound semiconductor-based photoelectric conversion unit 6. Specifically, an absolute value of $\{V_1-(V_2+V_3)\}$ is preferably not larger than 0.3 V, and further preferably not larger than 0.2 V. Setting the output voltage $V_2$ of the second photoelectric conversion unit 5 in the above range can optimize a voltage of parallel-connected component inside each photoelectric conversion cell, thereby to obtain a photoelectric conversion device having a high power output.

Examples of such a photoelectric conversion unit may include a crystalline silicon-based photoelectric conversion unit having a crystalline silicon i-type layer and an amorphous silicon germanium photoelectric conversion unit having amorphous hydrogenated silicon germanium i-type layer. When the compound semiconductor-based photoelectric conversion unit 6 is a chalcopyrite-based compound semiconductor photoelectric conversion unit, preferred examples of the second photoelectric conversion unit 5 may include the crystalline silicon-based photoelectric conversion unit. The crystalline silicon-based photoelectric conversion unit is normally made up of a P-type crystalline silicon layer, a substantially intrinsic crystalline silicon-based photoelectric conversion layer, and an N-type crystalline silicon layer. It is further preferable that an N-type amorphous silicon-based interface layer is inserted between the crystalline silicon-based photoelectric conversion layer and the N-type crystalline silicon layer. The high-frequency plasma enhanced CVD is suitable for formation of the second photoelectric conversion unit 5.

As conditions for forming each layer of the crystalline silicon-based photoelectric conversion unit, a substrate temperature of 100 to 300° C., a pressure of 30 to 3000 Pa, and a high-frequency power density of 0.1 to 0.5 W/cm$^2$ are preferably used. As a raw material gas for use in formation of the photoelectric conversion unit, a silicon-containing gas such as $SiH_4$ or $Si_2H_6$, or a mixture of those gases with $H_2$ is used. As a dopant gas for forming the P layer or the N layer in the photoelectric conversion unit, $B_2H_6$, $PH_3$, or the like is preferably used.

The intermediate transparent electrode layer 4 is formed on the second photoelectric conversion unit 5. The intermediate transparent electrode layer is preferably made up of a conductive metal oxide, specifically, $SnO_2$, ZnO, $In_2O_3$, and the like may be preferred examples thereof. The intermediate transparent electrode layer 4 is preferably formed by a deposition method such as CVD, sputtering or vapor deposition. When the second photoelectric conversion unit 5 has the N-type layer on the light incident side, the intermediate transparent electrode layer 4 is in contact with the N-type layer of the second photoelectric conversion unit 5 and with the N-type layer of the amorphous silicon-based photoelectric conversion unit 3. For this reason, at least an interface where the intermediate transparent electrode layer is in contact with the first photoelectric conversion unit 3 and an interface where the intermediate transparent electrode layer is in contact with the second photoelectric conversion unit need to be layers that can be electrically in contact with the N-type layer.

Further, depending upon deposition conditions for the amorphous silicon-based photoelectric conversion unit 3, the intermediate transparent electrode layer 4 may be exposed to a certain amount of hydrogen plasma, and a metal oxide constituting the intermediate transparent electrode layer 4 may be reduced, to cause significant deterioration in transmittance and resistance ratio. From the viewpoint of suppressing the reduction of metal oxide in the case of being exposed to hydrogen plasma, the surface of the intermediate transparent electrode layer 4 is preferably covered with ZnO having reduction resistance, and an interface where the intermediate transparent electrode layer 4 is in contact with the amorphous silicon-based photoelectric conversion unit 3 is preferably mainly composed of zinc oxide. Further, it is preferable to perform similar processing on the second photoelectric conversion unit 5 side surface of the intermediate transparent electrode layer 4, from the viewpoint of electric contact.

To prevent the intermediate transparent electrode layer 4 and the transparent electrode 2 from being short-circuited, intermediate electrode separation grooves C32 and 42 are preferably formed on the side surface of the intermediate transparent electrode layer 4 in each unit cell.

The intermediate electrode separation grooves C32 and C42 are preferably formed by removing the layers along from the third photoelectric conversion unit 6 to the intermediate transparent electrode layer 4. By doing so, the separation grooves C32 and C42 extending from the photoelectric conversion unit 6 to the intermediate transparent electrode layer 4 are filled with the material of amorphous silicon-based photoelectric conversion unit 3 formed thereafter. This can prevent the intermediate transparent electrode layer 4 and the transparent electrode 2 from being short-circuited. Further, a short-circuit via the transparent electrode 2, between the first photoelectric conversion unit 3 and the series-connected component 10, in which the photoelectric conversion units 5 and 6 are connected in series, can also be prevented.

Each of the separation groove C32 and the separation groove C42 is shown as one groove in FIGS. 3 and 4, since the photoelectric conversion device is illustrated in the drawing after formation of the first photoelectric conversion unit 3, the transparent electrode 2 and connection grooves B2 and D2. But the separation groove C32 in one unit cell and the separation groove C42 in the adjacent unit cell can be formed at once as one groove during their formation. For formation of the intermediate electrode separation grooves C32 and C42, a laser is preferably used. When the separation grooves C32 and C42 are formed by the laser, an IR laser having a wavelength of not less than 900 nm preferably irradiates from an opposite side of the transparent insulating substrate 1.

The separation groove C32 is preferably formed so as to be coupled with the metal electrode separation groove E2. With the separation groove C32 being coupled with the metal electrode separation groove E, the metal electrode separation groove E2 is filled with a material for forming the amorphous silicon-based photoelectric conversion unit 3 (configuration of FIG. 3) or a material for forming the insulating layer 8 (configuration of FIG. 4), and it is thereby possible to prevent the transparent electrode 2 in each unit cell and the metal electrode 7 in the adjacent unit cell from being short-circuited.

In the embodiment shown in FIG. 3, deposition of the first photoelectric conversion unit 3 is performed after formation of the intermediate transparent electrode layer and the intermediate electrode separation groove. Meanwhile, as in the embodiment of FIG. 4, the insulating layer 8 on the side surfaces of the intermediate transparent electrode layer may be formed on the surface of the intermediate electrode layer and on the surface of the series-connected component 10 by filling the separation grooves C32 and C42 with an insulating material before deposition the first photoelectric conversion unit 3. In the series-connected component 10, the second photoelectric conversion unit 5 and the third photoelectric conversion unit 6 are connected in series.

A material with a conductive ratio of not larger than $1 \times 10^4$ S/cm is preferably used for forming the insulating layer 8. For example, an insulating material such as silicon nitride or silicon oxide is preferably used. Among them, silicon nitride is particularly preferred from the viewpoints of insulation properties, deposition properties and durability.

As conditions for forming a silicon nitride insulating layer, conditions of a substrate temperature of 100 to 300° C., a pressure of 30 to 1500 Pa, and a high-frequency power density of 0.01 to 0.3 W/cm$^2$ are preferably used. As a raw material gas for use in formation of silicon nitride, $SiH_4$, $NH_3$, and $H_2$ are preferred.

On the intermediate transparent electrode layer 4, the amorphous silicon-based photoelectric conversion unit 3 as the first photoelectric conversion unit is formed. From the viewpoint of improving a conversion efficiency, the amorphous silicon-based photoelectric conversion unit 3 is preferably formed with an N-type layer, an I-type layer and a P-type layer in this order from the intermediate transparent electrode layer 4 side (opposite side to the transparent insulating substrate 1 side), and is for example made up of an N-type silicon-based interface layer, a substantially intrinsic amorphous silicon-based photoelectric conversion layer, and a P-type amorphous silicon carbide layer. High-frequency plasma enhanced CVD is suitable for formation of the amorphous silicon-based photoelectric conversion unit 3.

As conditions for forming each layer of the amorphous silicon-based photoelectric conversion unit 3, a substrate temperature of 100 to 300° C., a pressure of 30 to 1500 Pa, and a high-frequency power density of 0.01 to 0.5 W/cm$^2$ are preferably used. As a raw material gas for use in formation of the photoelectric conversion unit, a silicon-containing gas such as $SiH_4$ or $Si_2H_6$, or a mixture of those gases with $H_2$ is used. As a dopant gas for forming the P-type layer or the N-type layer in the photoelectric conversion unit, $B_2H_6$, $PH_3$, or the like is preferably used. An amorphous silicon-based photoelectric conversion unit 3 having wider bandgap may be obtained by willingly introducing $H_2$.

The transparent electrode 2 is formed on the amorphous silicon-based photoelectric conversion unit 3. The transparent electrode is preferably a conductive metal oxide, specifically, $SnO_2$, ZnO, $In_2O_3$, and the like may be preferred examples thereof. The transparent electrode 2 is preferably formed by a deposition method such as CVD, sputtering or vapor deposition. The transparent electrode 2 desirably has an effect of increasing incident light scattering. Specifically, a surface of the transparent electrode desirably has fine irregularities, so as to have the effect of increasing scattering of incident light.

After deposition of the amorphous silicon-based photoelectric conversion unit 3, the first-type connection groove B2 for short-circuiting the transparent electrode 2 inside each unit cell and the intermediate transparent electrode layer 4 inside the adjacent unit cell, and the second-type connection groove D2 for short-circuiting the transparent electrode 2 inside each unit cell and the metal electrode 7 inside the same unit cell are formed. The first-type connection groove B2 and the second-type connection groove D2 are filled with a conductive material constituting the transparent electrode 2, and the transparent electrode 2, the back-surface metal electrode 7 and the intermediate transparent electrode layer 4 are short-circuited.

The first-type connection groove B2 is formed by removing a portion of the amorphous silicon-based photoelectric conversion unit 3 which is adjacent to the separation groove C32 in the boundary region between each unit cell and the adjacent unit cell (the left side of the separation groove C32 in FIGS. 3 and 4). The second-type connection groove D2 is preferably formed by irradiating a laser from the opposite side to the transparent insulating substrate 1, to remove the amorphous silicon-based photoelectric conversion unit 3. When the laser is irradiated from the opposite side to the insulating substrate 1, since the laser light is reflected by the intermediate transparent electrode layer 4, only the amorphous silicon-based photoelectric conversion unit 3 is removed. As the laser, the IR laser with a wavelength of not smaller than 900 nm is preferred.

The second-type connection groove D2 is formed by removing side wall portions of the layers along from the amorphous silicon-based photoelectric conversion unit 3 to the compound semiconductor-based photoelectric conversion unit 6, in a region between the intermediate electrode separation groove C32 and the separation groove C4, which is a boundary region of each unit cell and the adjacent unit cell. The second-type connection groove D2 is preferably formed by removing the material for forming the amorphous silicon-based photoelectric conversion unit 3 having filled the boundary region of the unit cells or the material forming the insulating layer 8. The material may be removed by irradiating laser from the opposite side to the insulating substrate 1. As the laser, laser with a wavelength of 500 to 700 nm is preferably used.

The transparent electrode 2 is formed on the amorphous silicon-based photoelectric conversion unit 3. The transparent electrode 2 is preferably a conductive metal oxide, specifically, $SnO_2$, ZnO, $In_2O_3$ and the like may be preferred examples thereof. The transparent electrode 2 is preferably formed by a deposition method such as CVD, sputtering or vapor deposition.

Finally, a transparent electrode separation groove A2 separating the transparent electrode into unit cells is formed. The transparent electrode separation groove may be formed such that a IR laser with a wavelength of not less than 900 nm irradiates the transparent electrode side, or the deposition of the transparent electrode 2 is performed using a mask. Each separation groove and connection groove are formed so as to be arrayed in the order of the transparent electrode separation groove A2, the first-type connection groove B2, the intermediate electrode separation groove C32 (and the metal electrode separation groove E2) the second-type connection groove D2, and the intermediate electrode separation groove C42.

As thus described, the integrated photoelectric conversion device is obtained by formation of each layer, separation groove and connection groove. Inside each unit cell, the second photoelectric conversion unit 5 and the third photoelectric conversion unit 6 are connected in series to form the series-connected component 10. The series-connected component 10 is connected in parallel with the first photoelectric conversion unit 3 via the intermediate transparent electrode layer 4, the transparent electrode 2 and the metal electrode 7. Further, with the transparent electrode 2 inside each unit cell and the intermediate transparent electrode layer 4 in the adjacent unit cell being short-circuited, the adjacent plurality of unit cells are connected in series.

EXAMPLES

Hereinafter, examples of the thin film solar cell module according to the first embodiment of the invention will be described with reference to the drawings.

Example 1

FIG. 1 is the sectional view schematically showing the thin film solar cell module produced in Example 1.

First, on one principle surface of a transparent insulating substrate 1 made of glass plate with a thickness of 1.1 mm, a transparent electrode 2 made of $SnO_2$ and having a fine irregular structure on its surface was formed by thermal CVD.

Next, a YAG first harmonic laser irradiated the transparent insulating substrate 1 side to form separation grooves A1.

Next, the transparent insulating substrate 1 with the transparent electrode 2 was introduced into a high-frequency plasma enhanced CVD device for depositing an amorphous silicon-based photoelectric conversion unit 3. The substrate was heated to a predetermined temperature, and then an amorphous p-type silicon carbide layer, a substantially intrinsic amorphous silicon photoelectric conversion layer, and an n-type silicon layer were deposited sequentially. Next, a YAG second harmonic laser irradiated the amorphous silicon-based photoelectric conversion unit 3 under an air atmosphere to form connection grooves B1.

The transparent insulating substrate 1 where layers up to the amorphous silicon-based photoelectric conversion unit 3 had been formed was introduced into a sputtering apparatus for depositing an intermediate transparent electrode layer 4. The substrate was heated to a predetermined temperature, and then a zinc oxide layer was deposited on the amorphous silicon-based photoelectric conversion unit 3 by sputtering. Deposition of zinc oxide was performed using fine 100 μm wires as a mask to obtain an intermediate transparent electrode layer 4 having separation grooves C11.

The transparent insulating substrate 1 where layers up to the intermediate transparent electrode layer 4 had been formed was introduced into the high-frequency plasma enhanced CVD device for depositing a crystalline silicon photoelectric conversion unit as a second photoelectric conversion unit 5 on the intermediate transparent electrode layer 4. The substrate was heated to a predetermined temperature, and thereafter, a p-type silicon layer, a substantially intrinsic crystalline silicon photoelectric conversion layer, and an n-type silicon layer were sequentially deposited.

Subsequently, a zinc oxide layer and a CdS layer were formed as a window layer 62 of a compound semiconductor-based photoelectric conversion unit 6, and then a CIS layer as a light-absorbing layer 61 was deposited on the window layer. After the deposition of zinc oxide by thermal CVD, a YAG first harmonic laser irradiated the back-surface side to form separation grooves C21. A CdS layer was deposited on the zinc oxide layer by solution deposition. A CIS layer was formed on the CdS layer by three-source vapor deposition. During the deposition of the CIS layer, pulse light using a xenon light source irradiated the deposition surface side (a side opposite to the substrate 1) from an oblique direction so that the deposition surface is heated. It is to be noted that a band gap of a CIS layer deposited on a glass substrate under the same conditions for depositing above CIS layer was 1.0 eV. The band gap was obtained from a transmission spectrum by Tauc plotting.

Thereafter, a YAG second harmonic laser irradiated the transparent insulating substrate 1 side to remove the layers along from the amorphous silicon-based photoelectric conversion unit 3 to the compound semiconductor-based photoelectric conversion unit 6, so that connection grooves D1 were formed.

Finally, deposition of 3000 Å Mo layer as the metal electrode 7 was performed, and a YAG second harmonic laser irradiated the transparent insulating substrate 1 side to remove the layers along from the amorphous silicon-based photoelectric conversion unit 3 to the metal electrode 7, so that separation grooves E1 were formed.

A positive electrode and a negative electrode were drawn from cells located at both ends of three unit cells, so as to obtain a thin film solar cell module with three connected adjacent cells.

Example 2

FIG. 2 is the sectional view schematically showing the thin film solar cell module produced in Example 2. In Example 2, the cell separation process is different from that of Example 1. As in Example 1, the process up to the deposition of compound semiconductor-based photoelectric conversion unit 6 was performed. Thereafter, a YAG second harmonic laser irradiated the transparent insulating substrate 1 side to remove the layers along from the amorphous silicon-based photoelectric conversion unit 3 to the compound semiconductor-based photoelectric conversion unit 6, so that separation grooves C31 and the separation grooves C41 were formed.

Next, amorphous silicon nitride was deposited in boundary areas of the unit cells, namely in the area between the first-type connection groove B1 and the separation groove C11. Thereafter, as in Example 1, the connection grooves D1 were formed, then a back-surface metal electrode 7 was deposited followed by formation of separation grooves E1.

Pseudo solar light with a spectral distribution of AM 1.5 and an energy density of 100 mW/cm² was applied to the hybrid thin film solar cell modules produced in Example 1 and Example 2 under a measurement atmosphere with a solar cell temperature of 25±1° C., and a voltage and a current were measured, to obtain output characteristics of the thin film solar cells. Table 1 shows measurement results of open-circuit voltage (Voc), short-circuit current (Isc), a fill factor (FF) and a photoelectric conversion efficiency (Eff).

TABLE 1

|  | Voc [mV] | Isc [mA] | FF % | Eff % |
| --- | --- | --- | --- | --- |
| Example 1 | 899 | 27.5 | 66.4 | 16.4 |
| Example 2 | 913 | 27.1 | 69.4 | 17.2 |

Next, an example of the thin film solar cell module according to the second embodiment of the invention will be described with reference to the drawings.

Example 3

FIG. 3 is the sectional view schematically showing the thin film solar cell module produced in Example 3. First, on one principle surface of an insulating substrate 1 made of soda lime glass with a thickness of 2 mm, a Mo metal electrode 7 having separation grooves E2 was formed by electron beam vapor deposition with using a mask with 100 μm fine wires.

Subsequently, a CIS layer as a light-absorbing layer 61 of a compound semiconductor-based photoelectric conversion unit 6, and a CdS layer and a zinc oxide layer as a window layer 62 were deposited. The CIS layer was formed by three-source vapor deposition with a substrate temperature of 500° C. On the CIS layer, a CdS film was deposited by solution deposition, and finally, zinc oxide was deposited by sputtering. The deposition of zinc oxide was performed using a mask with fine 100 μm wires, to form separation grooves C22 and C23. It is to be noted that a band gap of a CIS layer deposited on a glass substrate under the same conditions for depositing the above CIS layer was 1.0 eV. The band gap was obtained from a transmission spectrum by Tauc plotting.

On the compound semiconductor-based photoelectric conversion unit 6, a crystalline silicon photoelectric conversion unit as a second photoelectric conversion unit 5 was deposited. The insulating substrate 1 where layers up to the compound semiconductor-based photoelectric conversion unit 6 had been formed was introduced into a high-frequency plasma enhanced CVD device, The substrate was heated to a predetermined temperature, and thereafter, an n-type silicon layer, a substantially intrinsic crystalline silicon photoelectric conversion layer, and a p-type silicon layer were sequentially deposited.

The insulating substrate 1 where layers up to the crystalline silicon photoelectric conversion unit 5 had been formed was introduced into the sputtering apparatus for depositing an intermediate transparent electrode layer 4. The substrate was heated to a predetermined temperature, and then a zinc oxide layer was formed on the crystalline silicon photoelectric conversion unit 5 by sputtering. Next, a YAG second harmonic laser irradiated the light incident side to remove the intermediate transparent electrode layer 4, the crystalline silicon photoelectric conversion unit 5, and the compound semiconductor-based photoelectric conversion unit 6, so that separation grooves C32 and C42 were formed.

The insulating substrate 1 where layers up to the intermediate transparent electrode layer 4 had been formed was introduced into the high-frequency plasma enhanced CVD device for depositing an amorphous silicon-based photoelectric conversion unit 3 on the intermediate transparent electrode layer 4. The substrate was heated to a predetermined temperature, and then an n-type silicon layer, an n-type amorphous silicon layer, a substantially intrinsic amorphous silicon photoelectric conversion layer, and a p-type silicon carbide layer were sequentially deposited.

After deposition of the amorphous silicon-based photoelectric conversion unit 3, a YAG second harmonic laser irradiated the light incident side, so that connection grooves D2 for short-circuiting the transparent electrode 2 and the metal electrode 7 were formed. Thereafter, connection grooves B2 for short-circuiting the transparent electrode 2 and the intermediate transparent electrode layer 4 in the mutually adjacent unit cells were formed by irradiating the light incident side with a YAG second harmonic laser.

Finally, ITO as a transparent electrode 2 was deposited by sputtering, so that the transparent electrode 2 and the intermediate transparent electrode layer 4 were short-circuited and the transparent electrode 2 and the metal electrode 7 were short-circuited. Separation grooves A2 were formed by using fine 100 μm wires as a mask during the deposition of the transparent electrode 2. After the deposition, annealing was performed at 150° C. for one hour.

A positive electrode and a negative electrode were drawn from cells located at both ends of three unit cells, so as to obtain a thin film solar cell module with three connected adjacent cells.

Example 4

FIG. 4 is the sectional view schematically showing the thin film solar cell module produced in Example 4. In Example 4, the cell separation process is different from that of Example 3. As in Example 3, the process up to the formation of separation grooves C32 and C42 was performed. Thereafter, amorphous silicon nitride was deposited in boundary areas of the unit cells in FIG. 4, namely in the area between the separation grooves C32 and C42. Next, the amorphous silicon-based photoelectric conversion unit 3 was deposited across the surface.

Thereafter, as in Example 3, the connection grooves B2 and the connection grooves D2 were formed, and deposition of the transparent electrode 2 having the separation groove A2 was performed.

Pseudo solar light with a spectral distribution of AM 1.5 and an energy density of 100 mW/cm$^2$ was applied to the hybrid thin film solar cell modules produced in Example 3 and Example 4 in a measurement atmosphere with a solar cell temperature of 25±1° C., and a voltage and a current were measured, to obtain output characteristics of the thin film solar cells. Table 1 shows measurement results of open-circuit voltage (Voc), short-circuit current (Isc), a fill factor (FF) and a photoelectric conversion efficiency (Eff).

TABLE 2

| | Voc [mV] | Isc [mA] | FF % | Eff % |
|---|---|---|---|---|
| Example 3 | 901 | 28.1 | 66.9 | 16.94 |
| Example 4 | 915 | 27.9 | 70.1 | 17.90 |

As shown in the Examples above, in the thin film solar cell module of the invention, since the respective photoelectric conversion units are electrically connected to make both currents and voltages match inside the unit cell, advantages of the respective photoelectric conversion units have been realized even after the multi-junction is formed, and high photoelectric conversion efficiency (Eff) has been obtained. It is found that, especially in Examples 2 and 4 where the insulating layer is formed on the side surface of each unit cell, the fill factors (FF) have been significantly improved as compared with those in Examples 1 and 3.

EXPLANATION OF REFERENCE NUMERALS 1 (transparent) insulating substrate
2 transparent electrode
3, 5, 6 photoelectric conversion unit
4 intermediate transparent electrode layer
61 light-absorbing layer
62 window layer
7 (back-surface) metal electrode
A, C, E separation groove
B, D connection groove

The invention claimed is:
1. A thin film solar cell module, at least comprising:
a transparent electrode;
a first photoelectric conversion unit;
an intermediate transparent electrode layer;
a second photoelectric conversion unit;
a third photoelectric conversion unit; and
a metal electrode, in this order from a light incident side,
the first to third photoelectric conversion units are electrically connected to form a unit cell, and a plurality of unit cells are integrated by connecting unit cells in series,
wherein the first photoelectric conversion unit is an amorphous silicon-based photoelectric conversion unit, and wherein the third photoelectric conversion unit is a compound semiconductor-based photoelectric conversion unit,
the second photoelectric conversion unit and the third photoelectric conversion unit being electrically connected in series to form a series-connected component inside each unit cell,
the series-connected component being electrically connected in parallel with the first photoelectric conversion unit via the transparent electrode and the intermediate transparent electrode layer,
wherein the transparent electrode inside each unit cell and the transparent electrode inside an adjacent unit cell are separated by a transparent electrode separation groove, the intermediate transparent electrode layer inside each unit cell and the metal electrode inside the same unit cell are insulated by an intermediate electrode separation groove, the metal electrode inside each unit cell and the metal electrode inside the adjacent unit cell are separated by a metal electrode separation groove, the transparent electrode inside each unit cell and the metal electrode inside the same unit cell are short-circuited by a second-type connection groove, the transparent electrode inside each unit cell and the intermediate transparent electrode layer inside the adjacent unit cell are short-circuited via a first-type connection groove, and the metal electrode inside each unit cell and the intermediate transparent electrode layer inside the adjacent unit cell are not directly connected, but are electrically connected via the transparent electrode inside the same unit cell, and thereby the photoelectric conversion units inside each unit cell are electrically connected and the plurality of unit cells are integrated.

2. The thin film solar cell module according to claim 1, wherein in each unit cell, an insulating layer is formed on a side surface of the series-connected component and on a side surface of the intermediate transparent electrode layer.

3. The thin film solar cell module according to claim 1, wherein
the amorphous silicon-based photoelectric conversion unit as the first photoelectric conversion unit has a P-type layer on the light incident side, and
the second photoelectric conversion unit and the compound semiconductor-based photoelectric conversion unit as the third photoelectric conversion unit each has an N-type layer on the light incident side.

4. The thin film solar cell module according to claim 1, wherein the transparent electrode, the first photoelectric conversion unit, the intermediate transparent electrode layer, the second photoelectric conversion unit, the third photoelectric conversion unit, and the metal electrode are arranged on a transparent insulating substrate in this order from the light incident side.

5. The thin film solar cell module according to claim 1, wherein the metal electrode, the third photoelectric conversion unit, the second photoelectric conversion unit, the intermediate transparent electrode layer, the first photoelectric conversion unit, and the transparent electrode are arranged on an insulating substrate in this order from a side opposite to the light incident side.

6. The thin film solar cell module according to claim 1, wherein a band gap of a light-absorbing layer of the third photoelectric conversion unit is not larger than 1.1 eV.

7. The thin film solar cell module according to claim 1, wherein the third photoelectric conversion unit is made of a chalcopyrite-based compound semiconductor.

8. The thin film solar cell module according to claim 1, wherein the second photoelectric conversion unit is a crystalline silicon-based photoelectric conversion unit.

9. The thin film solar cell module according to claim 1, wherein an output voltage $V_2$ of the second photoelectric conversion unit is smaller than an output voltage $V_1$ of the first photoelectric conversion unit, and the output voltage $V_2$ is larger than an output voltage $V_3$ of the third photoelectric conversion unit.

10. The thin film solar cell module according to claim 1, wherein an absolute value of $\{V_1-(V_2+V_3)\}$ is not larger than 0.3 V, wherein $V_1$ is an output voltage of the first photoelectric conversion unit, $V_2$ is an output voltage of the second photoelectric conversion unit and $V_3$ is an output voltage of the third photoelectric conversion unit.

11. The thin film solar cell module according to claim 1, wherein
an output voltage $V_2$ of the second photoelectric conversion unit is smaller than an output voltage $V_1$ of the first photoelectric conversion unit, and the output voltage $V_2$ is larger than an output voltage $V_3$ of the third photoelectric conversion unit, and an absolute value of $\{V_1-(V_2+V_3)\}$ is not larger than 0.3 V.

12. A method for manufacturing the thin film solar cell module according to claim 4, wherein at the time of deposition of the compound semiconductor-based photoelectric conversion unit as the third photoelectric conversion unit, light is irradiated from the surface side where the deposition is being performed.

* * * * *